(12) United States Patent
Maier et al.

(10) Patent No.: US 10,818,477 B2
(45) Date of Patent: Oct. 27, 2020

(54) IMPEDANCE MATCHING BETWEEN LOADS AND POWER GENERATORS

(71) Applicant: TRUMPF Huettinger GmbH + Co. KG, Freiburg (DE)

(72) Inventors: Florian Maier, Freiburg (DE); Nikolai Schwerg, Geneva (CH)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 108 days.

(21) Appl. No.: 15/963,475

(22) Filed: Apr. 26, 2018

(65) Prior Publication Data

US 2018/0247795 A1    Aug. 30, 2018

Related U.S. Application Data

(63) Continuation of application No. PCT/EP2016/075597, filed on Oct. 25, 2016.

(30) Foreign Application Priority Data

Oct. 26, 2015    (DE) .................. 10 2015 220 847

(51) Int. Cl.
*H01J 37/32* (2006.01)
*H03H 7/38* (2006.01)

(52) U.S. Cl.
CPC ......... *H01J 37/32183* (2013.01); *H03H 7/38* (2013.01)

(58) Field of Classification Search
CPC ........... H01J 37/32082; H01J 37/32091; H01J 37/32155; H01J 37/32165; H01J 37/32174; H01J 37/32183
(Continued)

(56) References Cited

U.S. PATENT DOCUMENTS 5,140,223 A    8/1992    Gesche et al.
6,259,334 B1   7/2001    Howald
(Continued)

FOREIGN PATENT DOCUMENTS

DE           39 23 661        1/1991
DE       10 2009 001 355      9/2010
(Continued)

OTHER PUBLICATIONS

JP Office Action in Japanese Appln. No. 2018-521396, dated Jul. 8, 2019, 18 pages (with English translation).
(Continued)

*Primary Examiner* — Tung X Le
(74) *Attorney, Agent, or Firm* — Fish & Richardson P.C.

(57) ABSTRACT

Methods and systems for impedance matching between loads and power generators are provided. The methods include: supplying a power generated by a power generator to a load by an impedance matching system that includes at least one reactance adjustable by at least one actuator and is configured to transform the load impedance at an input end of the load into a transformed load impedance at an input end of the impedance matching system, determining a power reflected at the load or at least one variable associated with the reflected power, determining, based on the reflected power or the at least one variable, that there is a mismatch, determining a trajectory in a complex load plane according to at least one specified criterion, and controlling the at least one actuator such that the transformed load impedance follows the trajectory to match an output impedance of the power generator.

17 Claims, 3 Drawing Sheets

(58) Field of Classification Search
USPC .................................................. 315/111.21
See application file for complete search history.

(56) References Cited

U.S. PATENT DOCUMENTS

| | | | |
|---|---|---|---|
| 7,157,857 | B2 | 1/2007 | Brouk et al. |
| 8,781,415 | B1 | 7/2014 | Coumou et al. |
| 2005/0134186 | A1 | 6/2005 | Brouk et al. |
| 2006/0032584 | A1 | 2/2006 | Itabashi et al. |
| 2009/0237170 | A1 | 9/2009 | Van Zyl et al. |
| 2009/0295295 | A1* | 12/2009 | Shannon ............ H01J 37/32082 315/111.21 |
| 2010/0171427 | A1 | 7/2010 | Kirchmeier et al. |
| 2010/0225411 | A1 | 9/2010 | Maier |
| 2013/0214683 | A1* | 8/2013 | Valcore, Jr. ....... H01J 37/32146 315/111.21 |
| 2013/0277333 | A1 | 10/2013 | Misra et al. |
| 2014/0155008 | A1 | 6/2014 | Van Zyl |
| 2014/0361690 | A1* | 12/2014 | Yamada ............ H01J 37/32155 315/111.21 |
| 2015/0076112 | A1* | 3/2015 | Sriraman .......... H01J 37/32082 216/67 |

FOREIGN PATENT DOCUMENTS

| | | |
|---|---|---|
| JP | 2001274651 | 10/2001 |
| JP | 2010 041558 | 2/2010 |
| JP | 2011124191 | 6/2011 |
| JP | 2011124192 | 6/2011 |
| WO | WO 2014/037994 | 3/2014 |

OTHER PUBLICATIONS

JP Office Action in Japanese Appln. No. 2018-521396, dated Nov. 25, 2019, 9 pages (with English translation).

International Search Report and Written Opinion in International Application No. PCT/EP2016/075597, dated Jan. 17, 2017, 20 pages (with English translation).

JP Office Action in Japanese Appln. No. 2018-521396, dated Mar. 30, 2020, 9 pages (with English translation).

* cited by examiner

IMPEDANCE MATCHING BETWEEN LOADS AND POWER GENERATORS

CROSS REFERENCE TO RELATED APPLICATIONS

This application is a continuation of and claims priority under 35 U.S.C. § 120 from PCT Application No. PCT/EP2016/075597 filed on Oct. 25, 2016, which claims priority from German Application No. DE 10 2015 220 847.8, filed on Oct. 26, 2015. The entire contents of each of these priority applications are incorporated herein by reference.

TECHNICAL FIELD

The invention relates to methods, devices and systems for matching a load impedance of a load to an output impedance of a power generator.

BACKGROUND

Impedance matching systems for high-frequency applications, in particular for high-frequency-plasma applications, are used to transform the impedance of the load, in particular of the plasma load, such that a power generator can supply the required active power to the load. This is usually achieved by means of resonant circuits having T, L or H (pi) topologies and including two or more variable reactances which can be designed as capacitors and/or inductors. The speed at which changes in the impedance of the load can be reacted to is limited by the dynamics of the variable reactances, which are usually driven mechanically by motors.

Arrangements of this type or similar are known, for example, from any of the following documents: DE 10 2009 001 355 A1, US 2006/0032584 A1, and US 2014/0155008 A1.

SUMMARY

The present disclosure provides methods and systems for faster and more reliable impedance matching between loads and power generators.

One aspect of the present disclosure features methods for matching the impedance of a load to the output impedance of a power generator. The methods include the following steps:

a. generating power by a power generator;
 b. supplying the power to a load by an impedance matching system including at least one reactance that can be adjusted by an actuator, where the impedance matching system transforms a load impedance at an input end of the load into a transformed load impedance at an input end of the impedance matching system;
 c. detecting or determining power reflected at the load, or at least one variable related thereto;
 d. checking, on the basis of the reflected power or the at least one variable related thereto, whether there is a mismatch;
 e. determining a trajectory in a complex load plane, e.g., in a Smith chart, according to at least one specified criterion; and
 f. controlling the at least one actuator such that the transformed load impedance follows the trajectory.

A trajectory in a complex load plane refers to a curve in a plane that describes the changing path of the impedance of a load. The plane is characterized in that the load can be shown as an impedance in a complex manner in the plane. The complex load plane can be, for example:

a rectangular coordinate system having a real part and an imaginary part of the reflection coefficient or of the impedance of the load, or of one value dependent on the aforementioned values,
 a polar coordinate system having the phase and the value of the reflection coefficient or of the impedance of the load, or of one value which is dependent on the aforementioned values,
 a Smith chart, or
 another comparable, planar format for representing the complex load.

In conventional plasma process topologies including a power generator, e.g., a high-frequency generator, an impedance matching system and a plasma chamber, which includes plasma as a load, the transformed load impedance is matched for the generator in the impedance matching system by tuning oscillating circuits, e.g., two series-oscillating circuits. Depending on the construction and design, the oscillating circuits are obtained by mechanical, electromagnetic, or other physical influence on the capacitors and inductors being used, by changing the operating frequency or by adding or removing further circuit elements. In this case, the impedance matching system is generally acted on such that the actuators control the reactances so that the reactances reach a value which indicates a good impedance match as soon as possible. The manner in which the impedance-matched value is reached is generally not considered. This can lead to the power generator being operated at a lower efficiency/in a disadvantageous load condition for a prolonged period of time during the matching process, and therefore also not being able to supply the required active power for a prolonged period of time.

By determining a trajectory by taking into account a specified criterion, and setting the impedance of the load according to the trajectory, according to the invention, a specified minimum reflected high-frequency power can be achieved more quickly, for example. Moreover, the methods also have the advantage that a constant, precisely adjustable high-frequency process energy can be provided in a more reliable manner. In some cases, the speed of reflection reduction can thus be improved as early as during the adjustment of the values of the reactances. Therefore, when the load changes, the path taken is not the direct path from the current impedance value to a value at which a minimum reflection occurs, as in the prior art, but is instead the path on which the reflection reduces as quickly as possible at a specified point in time, e.g., at the beginning, even if the value at which a minimum reflection occurs is reached only later.

The speed of reduction in the reflected power, achievement of a specified reflection coefficient or the efficiency of a power generator, for example, can be specified as the criterion. A suitable trajectory can be determined according to the criterion, and the values of the reactances can be correspondingly matched.

Furthermore, a value to be set can be determined for each reactance, the adjustment speed at which the value to be set can be achieved can be determined for each reactance, and the associated actuators can be correspondingly controlled. For example, the associated actuators can be controlled such that each reactance takes on the value to be set at the maximum adjustment speed. Alternatively, the associated actuators can be controlled such that all the reactances simultaneously take on the particular value to be set. It is also possible for at least one actuator to be controlled such that the value of the associated reactance changes at a specified adjustment speed, and for at least one actuator to be controlled such that the value of the associated reactance changes at the maximum adjustment speed. The maximum adjustment range of the reactance and the speed at which the reactance can actually be adjusted can also be taken into consideration when specifying the speed at which a reactance can change its value. The characteristics of the individual actuators can also be taken into consideration, and the controlling improved such that the trajectory in a complex load plane, e.g., in a Smith chart, reduces the reflected power (distance from the center of the complex load plane, for example of the Smith chart) as quickly as possible. This can be relevant when the dynamics of the actuators are different from one another.

In the complex load plane, e.g., in the Smith chart, forbidden ranges can be defined, and the trajectory can be determined such that the forbidden ranges are avoided. For example, ranges in which the actuators have low dynamics can be avoided in this way.

It is also conceivable for a first portion of the trajectory to be determined according to a first criterion, and for a second portion of the trajectory to be determined according to a second, different criterion. For example, the first portion of the trajectory can be determined such that a reflection coefficient or a reflected power fall below a specified threshold value. The second criterion can be, for example, that the impedances must be within a range in which the actuators have high dynamics, or in which the power supply has high efficiency. Moreover, it can be specified that the end position of the trajectory is not in the center of the complex load plane, e.g., the Smith chart.

A reflection coefficient can be defined as a ratio between a reflected power and a forward power and can be determined, for example, as the variable related to the reflected power. To determine the reflection coefficient, reflected voltage and/or current can be detected, for example.

Another aspect of the present disclosure features impedance matching systems that include at least one reactance that can be adjusted by an actuator, a measurement device configured to detect power reflected at a load or at least one variable related thereto, a trajectory determining unit configured to determine a trajectory in a complex load plane, e.g., in a Smith chart, on the basis of the detected reflected power or the variable related thereto together with at least one specified criterion, and a controller configured to control the at least one actuator according to the determined trajectory. The measurement device can be configured to detect a complex voltage and a complex current, or complex wave frequencies for forward waves and reflected waves of the power. The variables can be provided as the variables related to the reflected power. By determining a trajectory in the complex load plane, e.g., in the Smith chart, on the basis of at least one specified criterion, a more advantageous value can be achieved in the complex load plane, e.g., in the Smith chart, by taking a "detour," which also brings other advantages. In some cases, the provided variable in the complex plane, e.g., in the Smith chart, cannot be reached by a direct path, but is instead reached via the trajectory to be determined.

In this case, the impedance matching systems can be configured to change the load impedance at the input end of the load into a transformed load impedance at the input end of the impedance matching systems.

The trajectory can be determined quickly if the trajectory determining unit includes a logical circuit unit, e.g., an FPGA (field programmable gate array).

The reactance can be designed as a capacitor or an inductor. In some implementations, the impedance matching system includes a plurality of capacitors and/or inductors. The reactances can be provided in different circuit configurations in the impedance matching system. For example, they can be arranged as an L circuit or a H circuit.

The actuator can be designed as a motor or as a circuit element for connecting or disconnecting a reactance. Semiconductor switches, such as bipolar or metal-oxide-semiconductor (MOS) transistors, PIN diodes and relays, inter alia, are to be understood as circuit elements in the context of the invention. In principle, further circuit elements can be also conceivable. Moreover, the reactance can also be adjusted by changing the frequency of the generator.

Particularly effective and quick impedance matching can be accomplished when a plurality of reactances having associated actuators are provided.

Further features and advantages of the invention can be found in the following description of embodiments of the invention, with references to the figures in the drawings, which show details of the invention, and in the claims. The features shown therein are not necessarily to scale, and are depicted such that the particularities according to the invention can be seen clearly. The various features can be implemented separately or together in any desired combination in variants of the invention.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
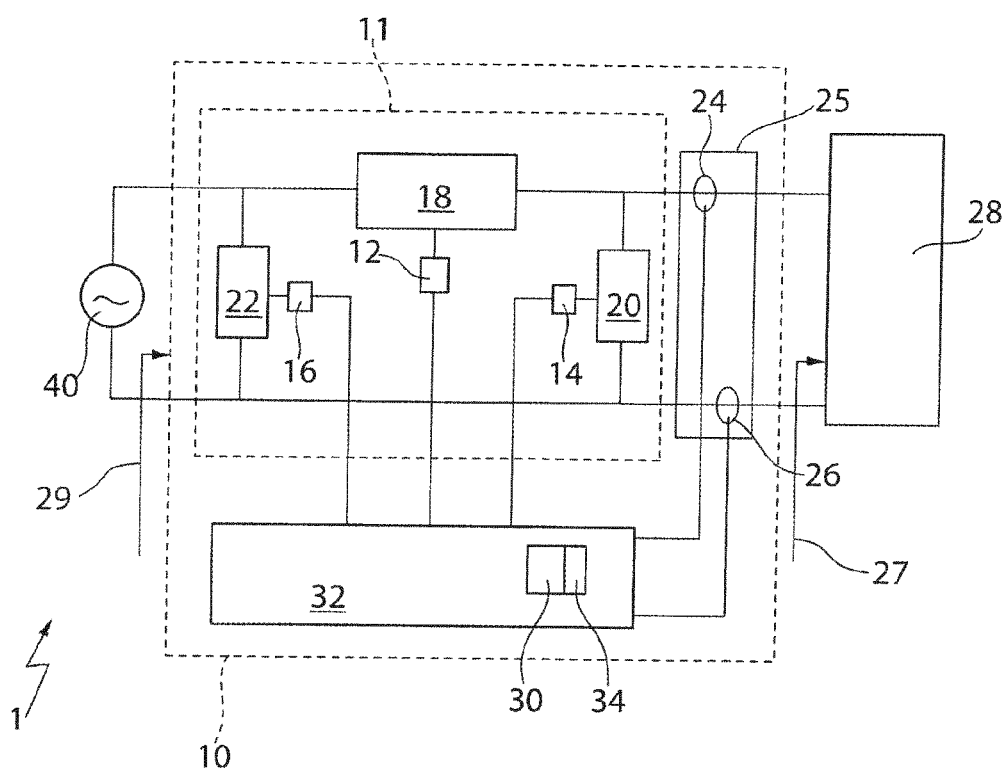
FIG. 1 is a schematic view of a plasma supply system.

FIG. 1 shows a plasma supply system 1 including a high-frequency power generator 40 which is connected to a load 28, e.g., a plasma load, by an impedance matching network 11. The impedance matching network 11 is a component of an impedance matching system 10. In the embodiment shown, the impedance matching network 11 includes reactances 18, 20, 22, which are each controlled by an actuator 12, 14, 16. The actuators 12, 14, 16 are controlled by a controller 32 in the impedance matching system 10. As taught in DE 10 2009 001 355 A1, and also in US Patent publication No. US20100225411A1, a variable reactance can be, for example, in the form of a capacitor having a stationary plate and a movable plate that can be moved relative to the stationary plate by a motor. The actuator can include the motor and can be controlled by the controller 32 to achieve a particular capacitance by moving the movable plate to change the capacitance of the capacitor. A measuring device 25, which can include measuring elements 24, 26, e.g., for determining variables including current and voltage, forward power and reflected power and/or impedance value and phase angle, is connected to the controller 32. The measuring device 25 can include current sensors or detectors, voltage sensors or detectors, power sensors or detectors such as directional couplers, or any combination thereof. Power reflected at the load 28, or a reflection coefficient, for example, can be determined on the basis of the variables detected by the measuring device 25. Reflected power occurs when there is a mismatch, e.g., when an impedance of the load 28 does not match an output impedance of the power generator 40. Alternatively or additionally, a corresponding measurement device can also be arranged at an input end of or within the impedance matching system 10. The impedance matching system 10 is capable of changing the load impedance 27 at an input end of the load 28 into a transformed load impedance 29 at an input end of the impedance matching system 10, e.g., on a side of the power generator 40.

A trajectory in a complex load plane, e.g., in the Smith chart, can be determined by a trajectory determining unit 30 (or a trajectory generator) in the impedance matching system 10. The trajectory can be determined such that impedance matching is achieved. The trajectory determining unit 30 is designed to determine a trajectory whilst taking into consideration at least one specified criterion, for example to reduce the reflection coefficient as quickly as possible. A quick calculation or determination can be made when the trajectory determining unit 30 includes a logical circuit unit 34, e.g., a field-programmable gate array (FPGA). The determined trajectory allows the actuators 12, 14, 16 to be controlled such that the load impedance follows the trajectory.

The trajectories can be improved in this way. For example, trajectories in which the reflection is increased in the short term, but in which on average faster and lower reflection values are achieved over the entire matching process, can also be taken into consideration.

The efficiency of the power generator 40, for example, can be a criterion for determining a trajectory. When the efficiency of the power generator 40 is higher, a power output from the power generator 40 becomes greater or larger.

Figure 2:
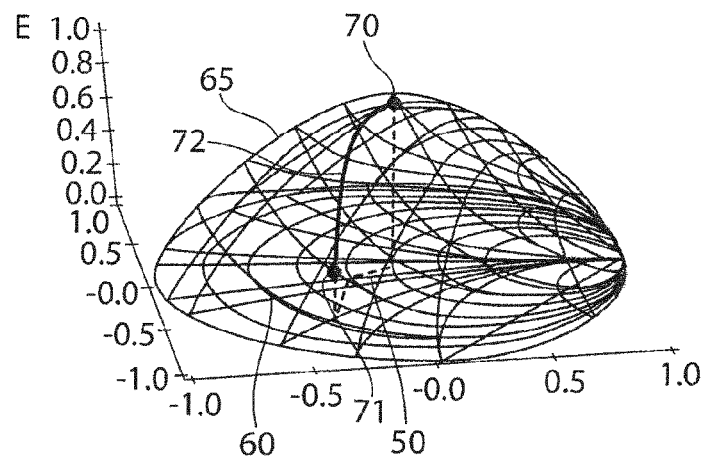
FIG. 2 is a graph that shows the efficiency of a power generator by means of a complex impedance plane.
Figure 3:
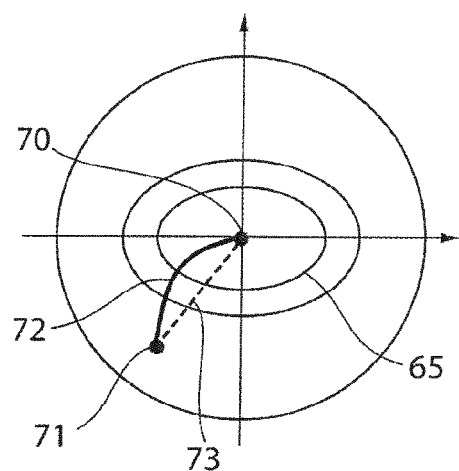
FIG. 3 is a graph that shows contours of constant efficiency on the complex impedance plane of FIG. 2.

In FIG. 2, the efficiency is plotted on a complex load plane, in this case a Smith chart 60, the efficiency maximum 70 being located in the center of the Smith chart 60 in this case. This can also be seen from the projection drawing in FIG. 3. In the case of a load change as shown, from position 71 to position 70 along the line 72, a greater increase in efficiency and therefore a greater power output of the power generator 40 results when impedance matching is carried out along a trajectory 50 than when impedance matching is carried out along a direct path, which is designated in FIG. 3 by a reference sign 73, for example. The efficiency of the power generator 40 can therefore be used as a criterion for determining the trajectory 50 here. In more general terms, a selected characteristic of the power generator 40 can be used as a criterion for determining the trajectory 50.

Figure 4:
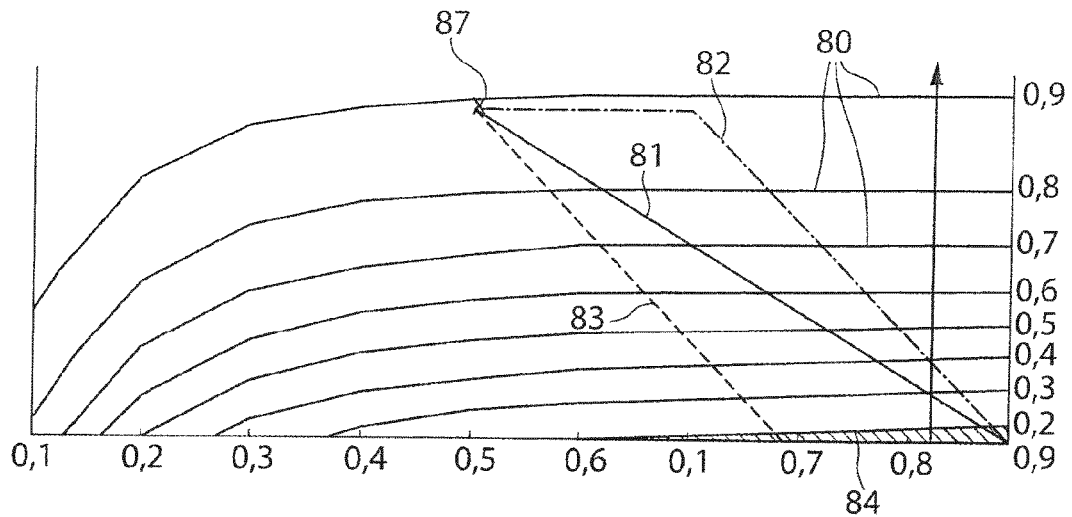
FIG. 4 is a graph that shows contours having a constant reflection coefficient plotted over reactance values.

FIG. 4 shows contours 80 of a constant reflection coefficient over the position or values of two reactances of an exemplary impedance matching network. The normalized variable of a first reactance is plotted on the horizontal axis, and the normalized variable of a second reactance is plotted on the vertical axis. For a given load impedance 87, three different trajectories 81, 82, 83 for approaching a range 84 having a reflection of <0.2 are shown. In this way, the reflection coefficient can be reduced below a threshold, e.g., below 0.2 in the embodiment shown, by the trajectories 81 to 83. Beginning at point 87, at which the impedance matching system 10 causes a reflection coefficient of almost 0.9, the reactances in the impedance matching system 10 can be adjusted such that the transformed load impedance 29 (FIG. 1) is brought into a range in which the reflection coefficient is below 0.2. This can be achieved on different trajectories. Three exemplary trajectories 81, 82, 83 can now be explained. The three trajectories 81, 82, 83 differ by the adjustment speed at which the reactances are adjusted in each case. This is demonstrated by FIG. 5A-5C. The time is plotted on the horizontal axis, and the change in the reactance, e.g., the capacitance, over time, is plotted on the vertical axis.

Figure 5A:
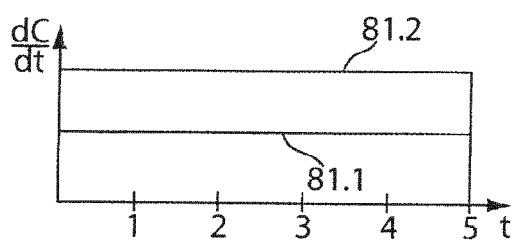
FIG. 5A-5C are a series of graphs that show speed profiles for two reactances.

The trajectory 81 is achieved according to FIG. 5A by adjusting the two reactances, e.g., capacitors, at a constant adjustment speed, the first reactance being adjusted according to the line 81.1 at a speed lower than the maximum adjustment speed, while the second reactance is adjusted according to the line 81.2 at the maximum adjustment speed thereof. In the selected embodiment, both reactances have the same maximum adjustment speed.

Figure 5B:
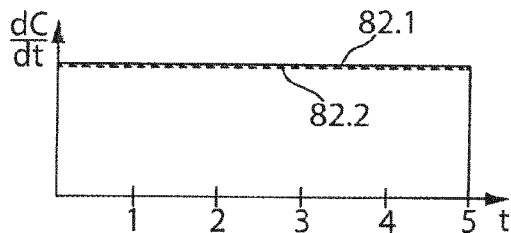

The trajectory 82 is achieved according to FIG. 5B by adjusting both reactances at the maximum adjustment speed thereof until the reactances reach the end point thereof (at five seconds), i.e., until the target value is achieved. Although the reactances are controlled differently for trajectories 81 and 82, the reactances reach the target value at approximately the same point in time.

Figure 5C:
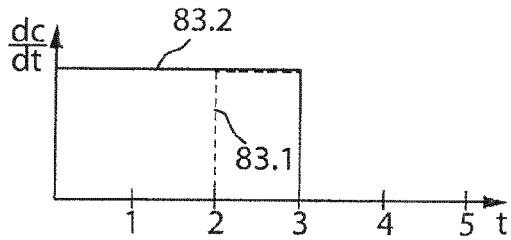

The trajectory 83 is achieved according to FIG. 5C by first adjusting only the second reactance at the maximum speed. At two seconds, the first reactance is also adjusted at the maximum speed such that both reactances simultaneously reach the target value thereof at three seconds. This is demonstrated by the lines 83.1 and 83.2 in FIG. 5C.

Figure 6:
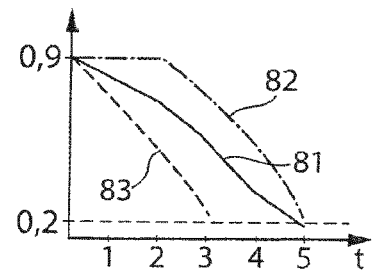
FIG. 6 is a graph that shows a reflection coefficient over time.

FIG. 6 shows a graph that explains the impedance matching speed. Time is plotted on the horizontal axis and the reflection coefficient is plotted on the vertical axis. The trajectory 83 reaches a reflection coefficient of <0.2 in the shortest time, e.g., at the fastest impedance matching speed. The trajectories 81, 82 result in a reflection coefficient of <0.2 being reached at a later point in time. This shows that controlling the reactances according to the trajectory 83 achieves a low reflection coefficient in the shortest time.

Other Embodiments

A number of embodiments of the invention have been described. Nevertheless, it will be understood that various modifications may be made without departing from the spirit and scope of the invention. Accordingly, other embodiments are within the scope of the following claims.

What is claimed is:

1. A method of matching a load impedance to an output impedance of a power generator, the method comprising:
   supplying power generated by the power generator to a load through an impedance matching system comprising one or more reactances that are adjustable by one or more actuators, wherein the impedance matching system is configured to transform the load impedance at an input end of the load into a transformed load impedance at an input end of the impedance matching system;
   determining at least one of a power reflected at the load and one or more variables associated with the reflected power;
   determining, based on the at least one of the reflected power and the one or more variables, that there is a mismatch between the load impedance and the output impedance of the power generator;

determining a trajectory in a complex load plane, according to at least one specified criterion; and controlling the one or more actuators to adjust the one or more reactances such that the transformed load impedance follows the trajectory to match the output impedance of the power generator.

2. The method of claim 1, wherein the trajectory in the complex load plane comprises a curve in a plane, wherein the curve describes a changing path of the transformed load impedance, and wherein the plane is characterized in that the transformed load impedance is shown in a complex manner.

3. The method of claim 1, wherein the at least one specified criterion comprises at least one of
a speed of reduction in the reflected power,
achievement of a specified reflection coefficient, and
achievement of an efficiency of the power generator.

4. The method of claim 1, further comprising:
determining a respective target value to be set for each of the reactances and a respective adjustment speed at which the respective target value is achieved for each of the reactances,
wherein controlling the one or more actuators comprises controlling a respective actuator to adjust each of the reactances to achieve the respective target value at the respective adjustment speed.

5. The method of claim 4, wherein controlling the one or more actuators comprises:
controlling the respective actuators for the reactances such that each of the reactances simultaneously achieves the respective target value at a maximum adjustment speed.

6. The method of claim 4, wherein controlling the one or more actuators comprises:
controlling the respective actuators for the reactances such that all of the reactances simultaneously achieve a particular value.

7. The method of claim 4, wherein controlling the one or more actuators comprises:
controlling the respective actuators for the reactances such that a value of a first reactance of the reactances changes at a specified adjustment speed and a value of a second reactance of the reactances changes at a maximum adjustment speed.

8. The method of claim 1, further comprising:
specifying an adjustment speed at which a value of a reactance changes, according to a maximum adjustment range of the reactance and a maximum adjustment speed of the reactance.

9. The method of claim 1, wherein controlling the one or more actuators comprises:
adjusting the actuators based on at least one characteristic of the actuators, such that the reflected power is reduced at a maximum speed when the transformed load impedance changes following the trajectory in the complex load plane.

10. The method of claim 9, wherein dynamics of the actuators are different from each other.

11. The method of claim 1, wherein determining a trajectory in a complex load plane comprises:
determining the trajectory to avoid forbidden ranges defined in the complex load plane.

12. The method of claim 1, wherein determining a trajectory in a complex load plane according to at least one specified criterion comprises:
determining a first portion of the trajectory according to a first criterion and a second portion of the trajectory according to a second, different criterion.

13. The method of claim 12, wherein determining a first portion of the trajectory comprises:
determining the first portion of the trajectory such that at least one of a reflection coefficient and a reflected power falls below a specified threshold value.

14. The method of claim 12, wherein the second criterion requires that the transformed load impedance is within a range in which the actuators have dynamics higher than a first threshold or in which the power generator has an efficiency higher than a second threshold.

15. The method of claim 12, wherein the second criterion requires that an end position of the trajectory is separate from a center of the complex load plane.

16. The method of claim 1, wherein the one or more variables associated with the reflected power comprise a reflection coefficient.

17. The method of claim 1, wherein the complex load plane comprises a Smith chart.

* * * * *